(12) United States Patent
Goto

(10) Patent No.: US 12,419,095 B2
(45) Date of Patent: Sep. 16, 2025

(54) SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Taiga Goto, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 424 days.

(21) Appl. No.: 18/161,329

(22) Filed: Jan. 30, 2023

(65) Prior Publication Data

US 2023/0290849 A1 Sep. 14, 2023

(30) Foreign Application Priority Data

Mar. 8, 2022 (JP) .................. 2022-035672

(51) Int. Cl.
*H10D 64/27* (2025.01)
*H10D 12/01* (2025.01)
*H10D 30/60* (2025.01)
*H10D 30/65* (2025.01)
(Continued)

(52) U.S. Cl.
CPC ......... *H10D 64/513* (2025.01); *H10D 12/038* (2025.01); *H10D 30/611* (2025.01); *H10D 30/658* (2025.01); *H10D 62/154* (2025.01); *H10D 62/158* (2025.01); *H10D 62/393* (2025.01)

(58) Field of Classification Search
CPC ............ H10D 30/668; H10D 30/0297; H10D 64/513; H10D 12/038; H10D 8/605; H10D 62/393; H10D 62/107; H10D 62/106; H10D 30/665; H10D 62/111; H10D 62/109; H10D 64/117
See application file for complete search history.

(56) References Cited

U.S. PATENT DOCUMENTS

| 5,448,083 A * | 9/1995 | Kitagawa ............. H10D 12/421 257/E29.199 |
| 10,269,910 B2 * | 4/2019 | Iwasaki ............. H10D 84/0142 |
| 10,276,666 B2 * | 4/2019 | Hoshi .................... H10D 64/62 |

(Continued)

*Primary Examiner* — Maliheh Malek
(74) *Attorney, Agent, or Firm* — Posz Law Group, PLC

(57) ABSTRACT

In a semiconductor device, a semiconductor substrate has an element region and a peripheral region, and trenches are defined on an upper surface of the semiconductor substrate. The trenches extend in a first direction, and are arranged at intervals in a second direction. The element region includes an n-type source region, a p-type contact region, a p-type body region, an n-type drift region, a p-type bottom region, and p-type connection regions. The bottom region is spaced from a bottom surface of the trenches. The connection regions connect the body region and the bottom region, extend in the first direction, and are arranged at intervals in the second direction. The element region has outer side portions and a central portion in the second direction. An interval between the connection regions in the second direction is greater in the outer side portion than in the central portion.

5 Claims, 12 Drawing Sheets

(51) Int. Cl.
*H10D 62/13* (2025.01)
*H10D 62/17* (2025.01)

(56) References Cited

U.S. PATENT DOCUMENTS

| | | | | |
|---|---|---|---|---|
| 2005/0221547 | A1* | 10/2005 | Yamauchi | H10D 62/111 |
| | | | | 257/E21.629 |
| 2007/0052014 | A1* | 3/2007 | Takahashi | H10D 62/127 |
| | | | | 257/330 |
| 2011/0291110 | A1* | 12/2011 | Suzuki | H10D 62/157 |
| | | | | 257/77 |
| 2012/0112306 | A1* | 5/2012 | Onishi | H10D 62/111 |
| | | | | 257/E29.007 |
| 2013/0168760 | A1* | 7/2013 | Hsieh | H10D 30/665 |
| | | | | 438/270 |
| 2014/0159149 | A1* | 6/2014 | Hsieh | H10D 62/107 |
| | | | | 257/331 |
| 2014/0175508 | A1* | 6/2014 | Suzuki | H10D 8/60 |
| | | | | 257/140 |
| 2015/0115286 | A1* | 4/2015 | Takeuchi | H10D 64/256 |
| | | | | 257/77 |
| 2015/0129895 | A1* | 5/2015 | Takeuchi | H10D 30/63 |
| | | | | 257/77 |
| 2015/0129957 | A1* | 5/2015 | Takaya | H10D 30/665 |
| | | | | 257/330 |
| 2015/0333153 | A1* | 11/2015 | Eguchi | H10D 48/30 |
| | | | | 438/270 |
| 2016/0149029 | A1* | 5/2016 | Takaya | H10D 30/668 |
| | | | | 438/270 |
| 2016/0247910 | A1* | 8/2016 | Suzuki | H10D 62/157 |
| 2016/0276469 | A1* | 9/2016 | Machida | H10D 62/141 |
| 2016/0329422 | A1* | 11/2016 | Saito | H10D 62/105 |
| 2017/0012136 | A1* | 1/2017 | Maegawa | H10D 62/107 |
| 2017/0025516 | A1* | 1/2017 | Saito | H10D 62/115 |
| 2017/0154833 | A1* | 6/2017 | Misumi | H10D 12/481 |
| 2017/0213907 | A1* | 7/2017 | Soeno | H10D 62/107 |
| 2017/0250179 | A1* | 8/2017 | Senoo | H10D 64/117 |
| 2018/0076289 | A1* | 3/2018 | Kurokawa | H10D 30/668 |
| 2018/0158898 | A1* | 6/2018 | Okawa | H10D 62/107 |
| 2018/0175149 | A1* | 6/2018 | Takaya | H10D 12/031 |
| 2018/0182889 | A1* | 6/2018 | Takaya | H10D 30/668 |
| 2018/0204906 | A1* | 7/2018 | Okada | H01J 37/3171 |
| 2018/0212028 | A1* | 7/2018 | Kuno | H10D 12/038 |
| 2018/0286974 | A1* | 10/2018 | Kumazawa | H10D 30/668 |
| 2018/0315819 | A1* | 11/2018 | Tanaka | H10D 62/157 |
| 2019/0109187 | A1* | 4/2019 | Misumi | H10D 62/109 |
| 2019/0109228 | A1* | 4/2019 | Kobayashi | H10D 62/127 |
| 2020/0020814 | A1* | 1/2020 | Miyake | H10D 8/605 |
| 2020/0168732 | A1 | 5/2020 | Mitani et al. | |
| 2021/0184031 | A1 | 6/2021 | Yamamoto et al. | |
| 2022/0102485 | A1* | 3/2022 | Takaya | H10D 64/513 |
| 2022/0293724 | A1* | 9/2022 | Saito | H10D 30/668 |
| 2023/0369483 | A1* | 11/2023 | Hanasato | H01L 21/0465 |
| 2023/0387194 | A1* | 11/2023 | Takaya | H10D 62/127 |
| 2023/0395710 | A1* | 12/2023 | Tega | H10D 62/8325 |
| 2023/0411449 | A1* | 12/2023 | Matsuura | H10D 62/127 |
| 2023/0420453 | A1* | 12/2023 | Murakami | H10D 62/393 |
| 2024/0088212 | A1* | 3/2024 | Watanabe | H10D 62/107 |
| 2024/0170567 | A1* | 5/2024 | Suzuki | H10D 62/127 |
| 2024/0203811 | A1* | 6/2024 | Kato | H10D 62/10 |
| 2024/0213341 | A1* | 6/2024 | Fujioka | H10D 30/668 |
| 2024/0250164 | A1* | 7/2024 | Kumita | H01L 21/02576 |
| 2024/0258425 | A1* | 8/2024 | Takaya | H10D 30/668 |
| 2024/0321951 | A1* | 9/2024 | Suzuki | H10D 62/157 |
| 2024/0339494 | A1* | 10/2024 | Darwish | H10D 62/393 |

* cited by examiner

SEMICONDUCTOR DEVICE

CROSS REFERENCE TO RELATED APPLICATION

The present application claims the benefit of priority from Japanese Patent Application No. 2022-035672 filed on Mar. 8, 2022. The entire disclosures of the above application are incorporated herein by reference.

TECHNICAL FIELD

The present disclosure relates to a semiconductor device.

BACKGROUND

For example, there is a semiconductor device having a semiconductor substrate, a gate insulating film, and a gate electrode. The semiconductor substrate has multiple trenches on its upper surface, and the gate insulating film is disposed to cover an inner surface of each trench. The gate electrode is disposed on the gate insulating film in each of the trenches. The semiconductor substrate includes an n-type source region, a p-type contact region, a p-type body region, an n-type drift region, a p-type bottom region, and multiple p-type connection regions. The source region is exposed on the upper surface of the semiconductor substrate and is in contact with the gate insulating film. The contact region is exposed on the upper surface of the semiconductor substrate. The body region is in contact with the gate insulating film below the source region and is in contact with the contact region. The drift region is in contact with the gate insulating film below the body region. The bottom region is located below the trench and is spaced from the bottom surface of the trench. Each of the connection regions connects the body region and the bottom region. The connection regions extend parallel to the trenches, and are spaced apart from each other in a direction perpendicular to the direction in which the trenches extend.

SUMMARY

The present disclosure describes a semiconductor device which is capable of reducing switching loss while reducing an on-resistance. According to an aspect of the present disclosure, a semiconductor device includes a semiconductor substrate that has an element region and a peripheral region on a periphery of the element region, a plurality of trenches defined on an upper surface of the semiconductor substrate, a gate insulating film covering an inner surface of each trench, and a gate electrode disposed in the trench and separated from the semiconductor substrate by the gate insulating film. The trenches extend in a first direction along the upper surface of the semiconductor substrate, and are arranged at intervals in a second direction perpendicular to the first direction along the upper surface of the semiconductor substrate. The element region includes an n-type source region, a p-type contact region, a p-type body region, an n-type drift region, a p-type bottom region, and p-type connection regions. The bottom region is spaced from a bottom surface of the trench. The connection regions connect the body region and the bottom region, extend in the first direction, and are arranged at intervals in the second direction. The element region has outer side portions and a central portion defined between the outer side portions in the second direction. An interval between the connection regions in the second direction is greater in at least one of the outer side portions than in the central portion.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
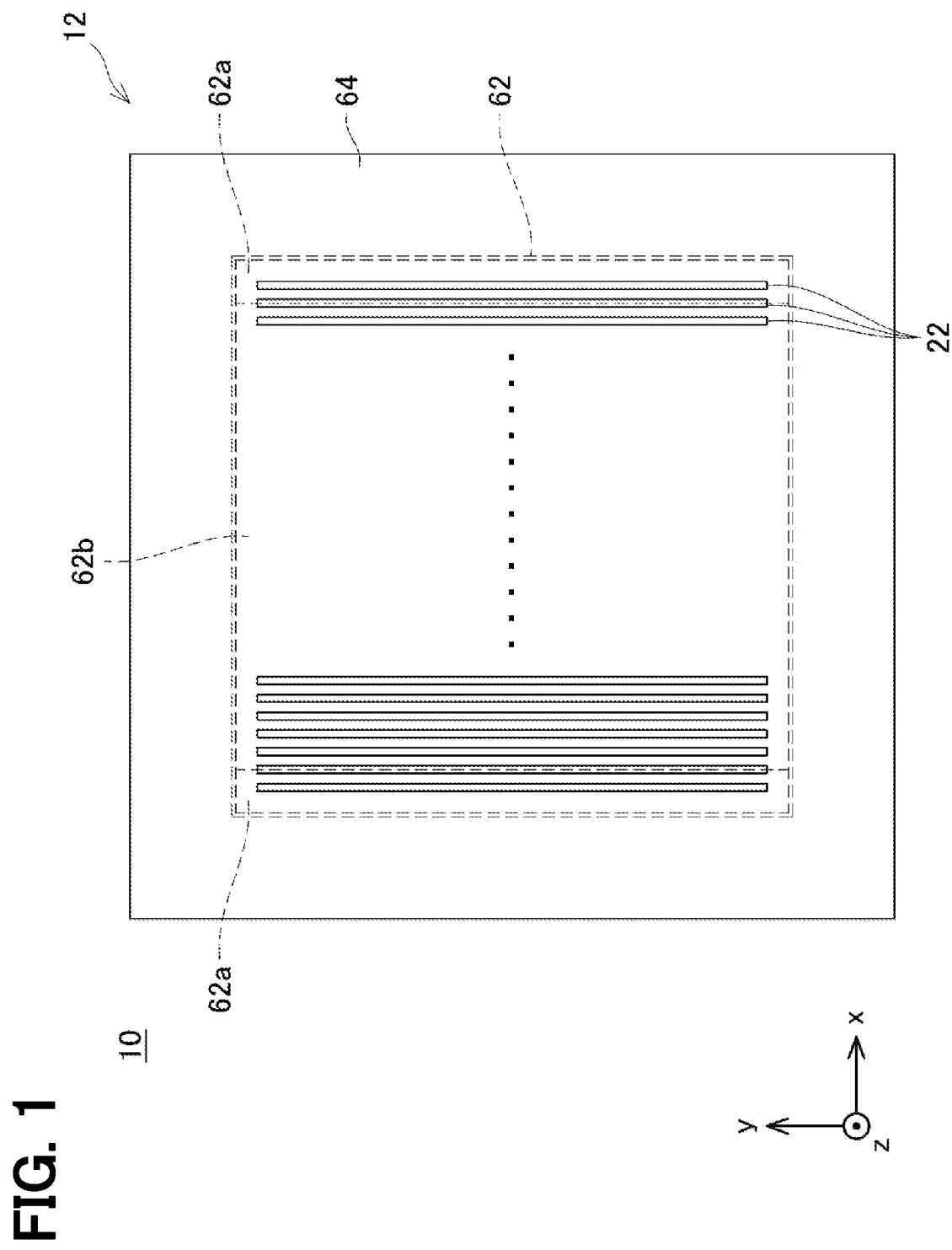
FIG. 1 is a plan view of a semiconductor device according to a first embodiment of the present disclosure.

To begin with, a relevant technology will be described only for understanding the embodiments of the present disclosure.

For example, there is a semiconductor device having trenches in a semiconductor substrate and in which the semiconductor substrate includes an n-type source region, a p-type contact region, a p-type body region, an n-type drift region, a p-type bottom region, and multiple p-type connection regions. The source region is exposed on an upper surface of the semiconductor substrate and is in contact with the gate insulating film. The contact region is exposed on the upper surface of the semiconductor substrate. The body region is in contact with a gate insulating film disposed in the trench below the source region and is in contact with the contact region. The drift region is in contact with the gate insulating film below the body region. The bottom region is located below the trench and is spaced from the bottom surface of the trench. Each of the connection regions connects the body region and the bottom region. The connection regions extend parallel to the trenches, and are spaced apart from each other in a direction perpendicular to the direction in which the trenches extend.

When such a semiconductor device is turned off, a depletion layer extends from the bottom region into the drift region. The depletion layer extending from the bottom region into the drift region suppresses electric field concentration at a bottom end of the trench.

In such a semiconductor device, a p-n diode (hereinafter referred to as a body diode) is parasitically formed by the p-type contact region and body region and the n-type drift region. In the operation of such a semiconductor device, when a forward biased voltage is applied to the body diode, the body diode is turned on and holes flow from the contact region into the drift region via the body region. Thereafter, when the voltage applied to the body diode is switched to a reverse biased voltage, the holes accumulated in the drift region flow into the contact region via the body region in the process of turning off the body diode. That is, a recovery current occurs.

In such a semiconductor device, the bottom region is provided inside the drift region, and is connected to the body region via the connection regions. Therefore, during reverse biasing, the holes accumulated in the drift region readily flow from the drift region to the bottom region, and thus most of the holes flow to the body region via the bottom region and the connection regions.

When such a semiconductor device is turned on, the depletion layer that has extended from the connection region to the drift region contracts. In a period before the depletion layer completely contracts, the depletion layer restricts the path through which the main current of the semiconductor device flows. If the connection regions are densely arranged, the on-resistance is high immediately after the semiconductor device is turned on.

If the connection regions are arranged not densely in order to reduce the on-resistance, the current density in each connection region is likely to be high when the holes accumulated in the drift region flows toward the body region at a time the voltage applied to the body diode is switched to the reverse biased voltage. Therefore, the electrical resistance increases when the recovery current flows, and the temperature of the semiconductor device is likely to rise. As a result, switching loss increases.

The present disclosure provides a semiconductor device which is capable of reducing the switching loss while reducing the on-resistance.

In an embodiment of the present disclosure, a semiconductor device includes: a semiconductor substrate, a plurality of trenches, a gate insulating film, and a gate electrode. The semiconductor substrate has an element region and a peripheral region disposed on a periphery of the element region. The plurality of trenches is defined on an upper surface of the semiconductor substrate. Each of the plurality of trenches extends in a first direction along the upper surface of the semiconductor substrate. The plurality of trenches is arranged spaced apart from each other in a second direction that is along the upper surface of the semiconductor substrate and perpendicular to the first direction. The gate insulating film covers an inner surface of each of the plurality of trenches. The gate electrode is disposed in each of the plurality of trenches and insulated from the semiconductor substrate by the gate insulating film. The element region includes, an n-type source region, a p-type contact region, a p-type body region, an n-type drift region, a p-type bottom region, and a plurality of p-type connection regions. The n-type source region is exposed on the upper surface of the semiconductor substrate and is in contact with the gate insulating film disposed in a corresponding trench. The p-type contact region is exposed on the upper surface of the semiconductor substrate. The p-type body region is in contact with the gate insulating film disposed in the corresponding trench at a position below the source region, and is in contact with the contact region. The n-type drift region is in contact with the gate insulating film disposed in the corresponding trench at a position below the body region, and is separated from the source region by the body region. The p-type bottom region is disposed below the corresponding trench and spaced from a bottom surface of the corresponding trench, and is surrounded by the drift region. Each of the plurality of p-type connection regions connects the body region and the bottom region, and extends in the first direction. The plurality of connection regions is arranged spaced apart from each other in the second direction. The element region has outer side portions at opposite ends of the element region in the second direction, and a central portion defined between the outer side portions. An interval in the second direction between the connection regions provided in at least one of the outer side portions is greater than an interval in the second direction between the connection regions provided in the central portion.

In such a semiconductor device, the element region has the outer side portions at opposite ends of the element region in the second direction in which the trenches and the connection regions are arranged, and a central portion between the outer side portions. The interval between the connection regions in at least one of the outer side portions is larger than the interval between the connection regions in the central portion. In the at least one of the outer side portions, since the connection regions are widely spaced apart from each other, the on-resistance is low. Therefore, the on-resistance of the element region as a whole can be reduced. In addition, the outer side portion is adjacent to the peripheral region. In the peripheral region, since a voltage is less likely to be applied to a body diode, holes are hardly accumulated in the drift region during forward biasing. That is, since few holes flow into the outer side portion from the peripheral region, the density of holes accumulated in the drift region during the forward biasing is low in the outer side portion. Therefore, the recovery current is small in the outer side portion, and the temperature of the semiconductor device hardly rises even if the interval between the connection regions in the outer side portion is large. For this reason, the switching loss is small in the element region as a whole. Accordingly, in the semiconductor device, switching loss can be reduced while reducing the on-resistance.

In an embodiment of the present disclosure, in the semiconductor device, the interval in the second direction between the connection regions provided in the second direction in the outer side portion may be increased toward the end of the element region.

The amount of holes accumulated in the drift region when the body diode is forward biased decreases toward the end of the element region. In the configuration described above, since the interval between the connection regions is increased toward the end of the element region, it is possible to more preferably achieve the reduction in on-resistance and the reduction in switching loss.

In an embodiment of the present disclosure, in the semiconductor device, each of the plurality of bottom regions may extend in the second direction, and the plurality of bottom regions may be spaced apart from each other in the first direction.

In such a configuration, the direction in which the bottom region extends and the direction in which the connection region extends intersect to each other. Thus, the bottom region and the connection region can be connected more reliably than, for example, a configuration in which the bottom region and the connection region extend parallel to each other.

In an embodiment of the present disclosure, in the semiconductor device, each of the outer side portions may further include a plurality of p-type auxiliary connection regions. The plurality of auxiliary connection regions may each connect the body region and the bottom region, and be arranged spaced apart from each other in the first direction.

In such a configuration, in the outer side portion, holes flow from the bottom region to the body region via the auxiliary connection region in addition to the connection region when the body diode is reverse biased. In this case, since the holes can flow while branching in many paths, switching loss can be further reduced. In addition, since the auxiliary connection regions are spaced apart in the first direction, the range of the depletion layer extending from the auxiliary connection region to the drift region is narrow, and the path of the main current is less likely restricted when the semiconductor device is turned on. Therefore, the increase in on-resistance can be suppressed.

In an embodiment of the present disclosure, in the semiconductor device, an interval defined between the trenches in the second direction in the outer side portion may be smaller than an interval defined between the trenches in the second direction in the central portion.

In such a configuration, since the channel density is increased in the outer side portions, the channel resistance, that is, the on-resistance can be reduced.

Embodiments of the present disclosure will be described further in detail with reference to the drawings.

First Embodiment

A semiconductor device 10 of a first embodiment is shown in FIGS. 1 to 4. The semiconductor device 10 is a metal oxide semiconductor field effect transistor (MOSFET). As shown in FIG. 1, the semiconductor device 10 has a semiconductor substrate 12. The semiconductor substrate 12 has an element region 62 and a peripheral region 64. Components of the MOSFET are formed inside the semiconductor substrate 12 in the element region 62. The peripheral region 64 is arranged around the element region 62. Although not shown, a peripheral voltage withstand structure, such as a guard ring, is formed inside the semiconductor substrate 12 in the peripheral region 64. For example, the semiconductor substrate 12 is made of silicon carbide (SiC). However, the material of the semiconductor substrate 12 is not particularly limited, and may be other semiconductor materials such as silicon (Si) or gallium nitride (GaN). Hereinafter, one direction parallel to an upper surface 12a of the semiconductor substrate 12 is referred to as an x direction, and a direction parallel to the upper surface 12a of the semiconductor substrate 12 and perpendicular to the x direction is referred to as a y direction. Also, a thickness direction of the semiconductor substrate 12 is referred to as the z direction. The z direction is perpendicular to the x direction and the y direction.

Figure 2:
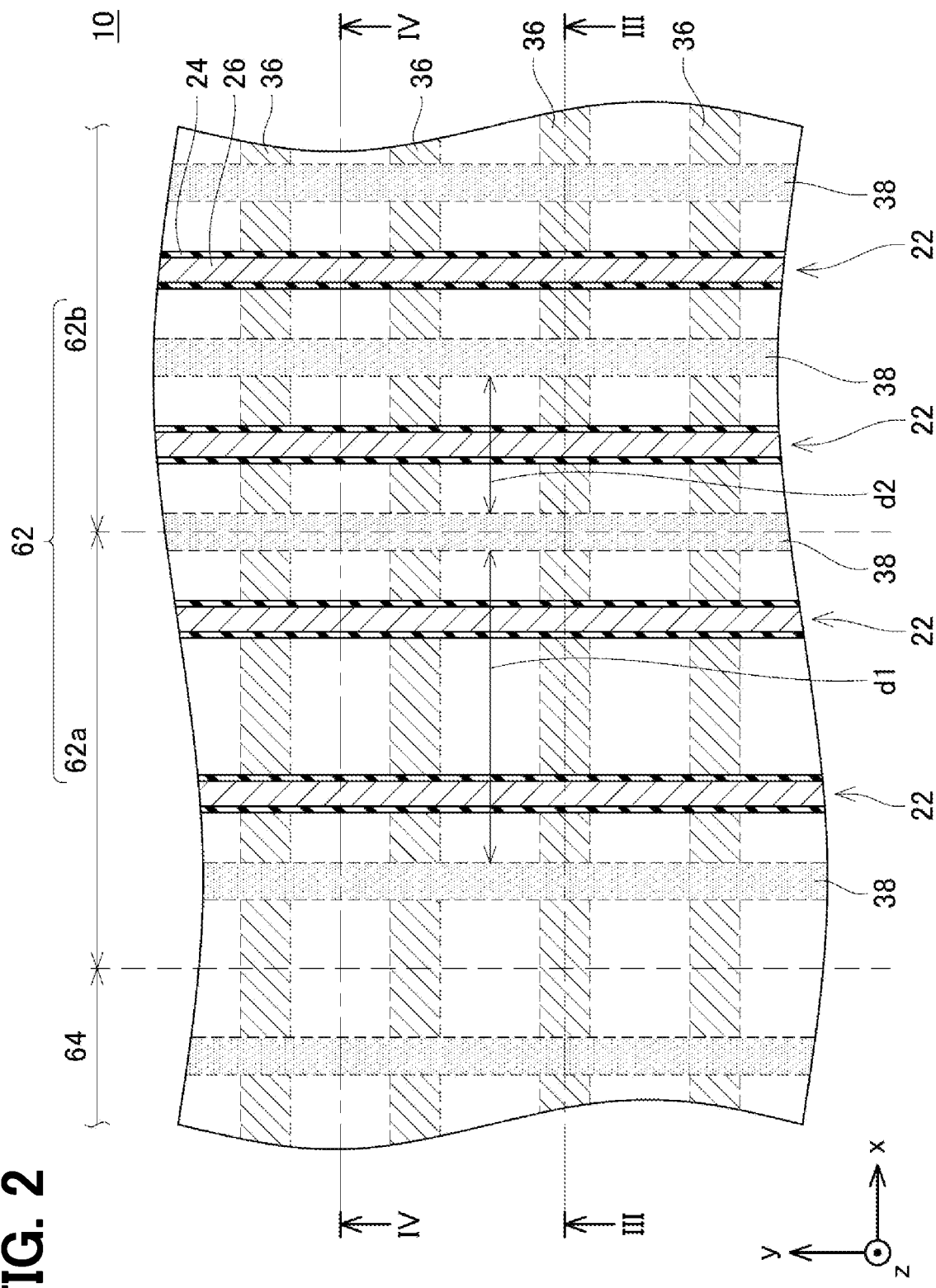
FIG. 2 is an enlarged plan view of a part of the semiconductor device including a boundary between an element region and a peripheral region.
Figure 3:
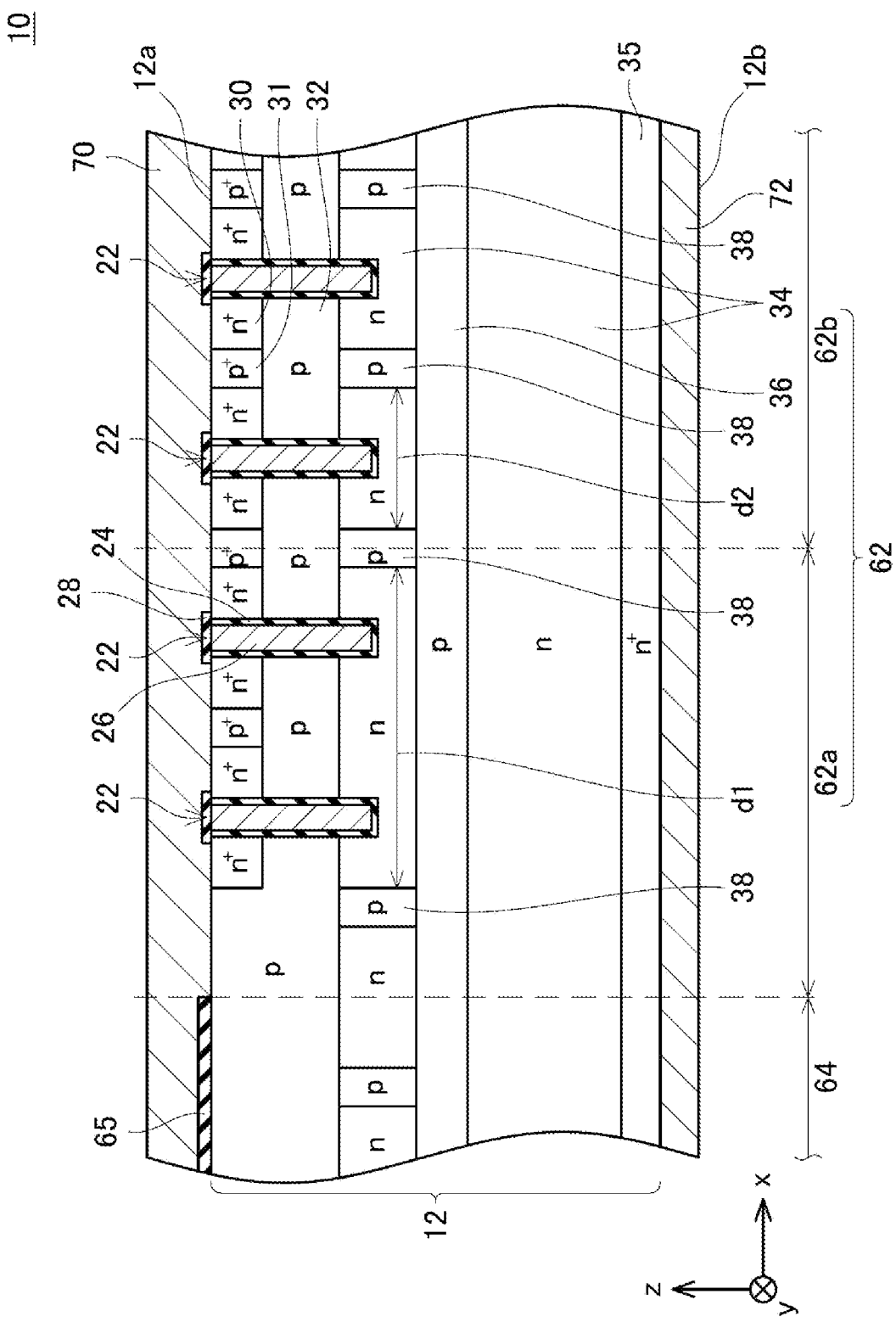
FIG. 3 is a cross-sectional view taken along a line III-III of FIG. 2.
Figure 4:
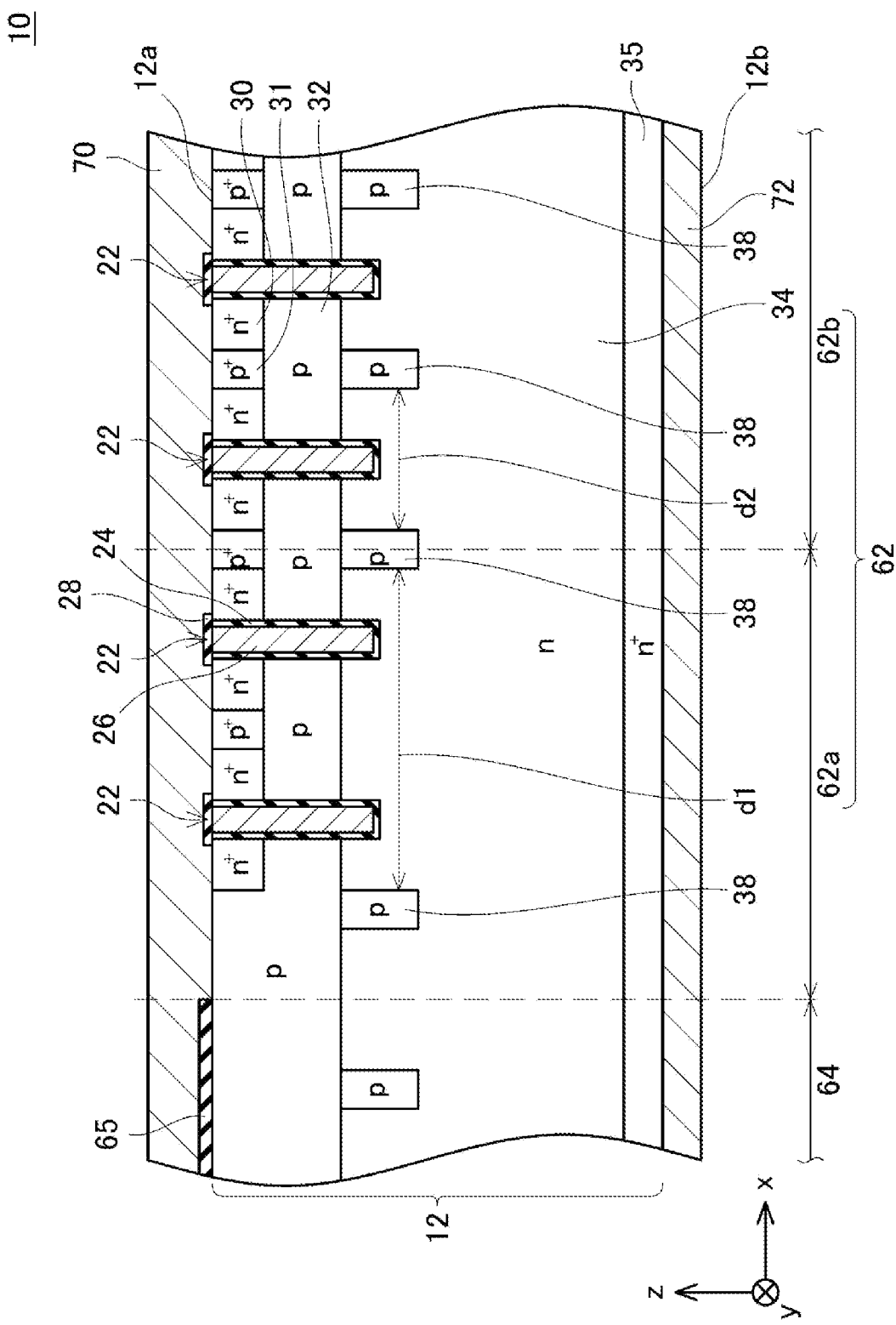
FIG. 4 is a cross-sectional view taken along a line IV-IV of FIG. 2.

As shown in FIG. 1, in the element region 62, trenches 22 are defined in the upper surface 12a of the semiconductor substrate 12. Each of the trenches 22 extends long along the y direction. Thus, the y direction corresponds to a longitudinal direction of the trench 22. The multiple trenches 22 extend parallel to each other. The trenches 22 are arranged at intervals in the x direction. FIG. 2 is an enlarged view of a part shown in FIG. 1 including a boundary between the element region 62 and the peripheral region 64 adjoined in the x direction. Note that, in FIGS. 1 and 2, illustration of the components above the upper surface 12a of the semiconductor substrate 12, such as an insulating film and an electrode, is omitted. As shown in FIGS. 2 to 4, a gate insulating film 24 and a gate electrode 26 are provided in each trench 22. The gate insulating film 24 covers the inner surface of each trench 22. The gate electrode 26 is disposed inside each trench 22. The gate electrode 26 is insulated from the semiconductor substrate 12 by the gate insulating film 24.

As shown in FIGS. 3 and 4, the top surface of each gate electrode 26 is covered with an interlayer insulating film 28. In the peripheral region 64, an insulating film 65 covers substantially the entire upper surface 12a of the semiconductor substrate 12. An upper electrode 70 is arranged on the upper surface 12a of the semiconductor substrate 12. In the element region 62, the upper electrode 70 is in contact with the upper surface 12a of the semiconductor substrate 12 at locations where the interlayer insulating film 28 is not provided. The upper electrode 70 is insulated from the gate electrode 26 by the interlayer insulating film 28. A lower electrode 72 is arranged on a lower surface 12b of the semiconductor substrate 12. The lower electrode 72 is in contact with substantially the entire lower surface 12b of the semiconductor substrate 12.

The element region 62 is provided with multiple source regions 30, multiple contact regions 31, a body region 32, a drift region 34, a drain region 35, multiple bottom regions 36, and multiple connection regions 38.

Each of the source regions 30 is an n-type region. The source region 30 is provided at a position exposed on the upper surface 12a of the semiconductor substrate 12. The source region 30 is in ohmic contact with the upper electrode 70. The source region 30 is disposed at the side surface of the trench 22, and is in contact with the gate insulating film 24 disposed inside the trench 22.

Each of the contact regions 31 is a p-type region. The contact region 31 is provided at a position exposed on the upper surface 12a of the semiconductor substrate 12. The contact region 31 is arranged at a position interposed between two source regions 30. The contact region 31 is in ohmic contact with the upper electrode 70.

The body region 32 is a p-type region. The body region 32 has a p-type impurity concentration lower than that of the contact region 31. The body region 32 is in contact with the bottom of the source region 30 and the bottom of the contact region 31. The body region 32 is in contact with the gate insulating film 24 disposed in each of the trenches 22 below the source regions 30. The body region 32 is arranged across the element region 62 and the peripheral region 64.

The drift region 34 is an n-type region. The drift region 34 is arranged below the body region 32. The drift region 34 is in contact with the bottom of the body region 32. The drift region 34 is in contact with the gate insulating film 24 disposed in each of the trenches 22 below the body region 32. The drift region 34 is separated from the source regions 30 by the body region 32. The drift region 34 is arranged across the element region 62 and the peripheral region 64.

The drain region 35 is an n-type region. The drain region 35 is arranged below the drift region 34. The drain region 35 has an n-type impurity concentration higher than that of the drift region 34. The drain region 35 is in contact with the bottom of the drift region 34. The drain region 35 is exposed on the lower surface 12b of the semiconductor substrate 12. The drain region 35 is in ohmic contact with a lower electrode 72 disposed on the lower surface 12b of the semiconductor substrate 12. The drain region 35 is arranged across the element region 62 and the peripheral region 64.

Each of the bottom regions 36 is a p-type region. Each of the bottom regions 36 extends in a direction perpendicular to the longitudinal direction of the trenches 22, that is, extends in the x direction. As shown in FIG. 2, the bottom regions 36 are arranged at intervals in the y direction. Each of the bottom regions 36 is positioned below the trenches 22 and spaced from the bottom surfaces of the trenches 22. A periphery of each bottom region 36 is surrounded by the drift region 34. Each of the bottom regions 36 extends from the element region 62 into the peripheral region 64, that is, extends across the element region 62 and the peripheral region 64.

Each of the connection regions 38 is a p-type region. As shown in FIG. 2, each of the connection regions 38 extends parallel to the trenches 22, that is, extends in the y direction. The connection regions 38 are arranged spaced apart from each other in the direction perpendicular to the longitudinal direction of the trenches 22. Each of the connection regions 38 is arranged in a region between adjacent two trenches 22 when viewed from the top, that is, in a plan view shown in FIG. 2. As shown in FIG. 3, each of the connection regions 38 connects the body region 32 and the bottom region 36. The connection regions 38 are provided also in the peripheral region 64.

As noted above, each of the bottom regions 36 is connected to the body region 32 via the respective connection regions 38. Therefore, each of the bottom regions 36 is connected to the upper electrode 70 through the connection regions 38, the body region 32 and the contact region 31. As such, the potential of each bottom region 36 is approximately equal to the potential of the upper electrode 70.

As shown in FIG. 1, the element region 62 has two outer side portions 62a and a central portion 62b. The outer side portions 62a are located at opposite ends of the element region 62 in the x direction. Although only one end of the element region 62 in the x direction is shown in FIGS. 2 to 4, the other outer side portion 62a is located at the other end of the element region 62 in the x direction. The central portion 62b is located between the two outer side portions 62a.

As shown in FIG. 3, each connection region 38 is provided in a respective range defined between the adjacent trenches 22 in the central portion 62b. That is, in the central portion 62b, the connection regions 38 and the trenches 22 are alternately arranged along the x direction. On the other hand, the connection region 38 is not provided in a range defined between the adjacent two trenches 22 in the outer side portion 62a. The connection regions 38 are provided in the peripheral region 64 at the same intervals as those in the central portion 62b. Therefore, an interval d1 defined between the connection regions 38 in the outer side portion 62a in the x direction is greater than an interval d2 between the connection regions 38 in the central portion 62b in the x direction. Although not shown, the interval between the connection regions 38 is similarly set in the other outer side portion 62a as well. The interval between two adjacent trenches 22 is approximately equal between the outer side portions 62a and the central portion 62b.

When the semiconductor device 10 is used, the lower electrode 72 is applied with a higher potential than that to the upper electrode 70. When a voltage equal to or higher than a gate threshold is applied to the gate electrode 26, a channel is formed in the body region 32 in a range in contact with the gate insulating film 24, and the semiconductor device 10 is turned on. When the voltage applied to the gate electrode 26 is lowered below the gate threshold, the channel disappears and the semiconductor device 10 is turned off.

When the semiconductor device 10 is in an off state, the potential of the lower electrode 72 is much higher than the potential of the upper electrode 70. In this state, the drift region 34 has a potential approximate to the potential of the lower electrode 72. Also, as described above, the bottom region 36 has a potential approximately the same as the potential of the upper electrode 70. Therefore, a high reverse voltage is applied to the p-n junction at the interface between the drift region 34 and the bottom region 36. With this, a depletion layer extends widely from each bottom region 36 into the drift region 34. As a result, electric field concentration at positions near the lower ends of the trenches 22 is suppressed, and the breakdown voltage of the semiconductor device 10 is ensured. The reverse voltage is also applied to the p-n junction at the interface between the connection region 38 and the drift region 34. Therefore, the depletion layer extends from the connection region 38 into the drift region 34 as well.

When the semiconductor device 10 is turned on, holes are supplied from the upper electrode 70 to each bottom region 36 via the contact regions 31, the body region 32 and the connection regions 38. As a result, the depletion layer extending from the connection region 38 and the bottom region 36 into the drift region 34 contracts. In a period before the holes are supplied to the connection region 38 and the bottom region 36, the depletion layer is extended from the connection region 38 and the bottom region 36 into the drift region 34. Therefore, the path of a main current is restricted by the depletion layer immediately after the semiconductor device 10 is turned on. In the present embodiment, however, the interval d1 between the connection regions 38 at the outer side portion 62a of the element region 62 is widened. Therefore, a non-depletion portion relatively widely exists in the drift region 34 in the outer side portion 62a. As such, immediately after the semiconductor device 10 is turned on, the relatively wide range of the drift region 34, in particular, the drift region 34 located between the trenches 22 in the outer side portion 62a can be used for the path of the main current. Therefore, in the semiconductor device 10 of the present embodiment, the on-resistance of the element region 62 as a whole can be reduced.

Inside the semiconductor substrate 12, a p-n diode (hereinafter referred to as a body diode) is parasitically formed by the p-type contact region 31 and body region 32 and the n-type drift region 34 and drain region 35. In the operation of the semiconductor device 10, there is a case where the upper electrode 70 is applied with the higher potential than that of the lower electrode 72. When the potential of the upper electrode 70 is higher than that of the lower electrode 72, that is, when in forward bias, the body diode is turned on. That is, holes flow from the upper electrode 70 into the drift region 34 via the contact region 31 and the body region 32.

Thereafter, when the potential of the lower electrode 72 is switched to a higher potential than the upper electrode 70, that is, when in reverse bias, the holes accumulated in the drift region 34 flows to the upper electrode 70 via the body region 32 and the contact region 31 in a process where the body diode is turned off. That is, a recovery current flows. The semiconductor device 10 has the multiple bottom regions 36 inside the drift region 34, and the bottom regions 36 are connected to the body region 32 through the connection regions 38. Therefore, during the reverse biasing, the holes accumulated in the drift region 34 easily flow from the drift region 34 to the bottom regions 36, and thus most of the holes flow to the body region 32 via the bottom regions 36 and the connection regions 38.

In the present embodiment, the interval d2 between the connection regions 38 in the central portion 62b of the element region 62 is narrow. The interval d2 is smaller than the interval d1. That is, the connection regions 38 are densely arranged in the central portion 62b. Therefore, there are many paths for holes to flow from the bottom regions 36 to the body region 32, and thus the holes are quickly discharged to the upper electrode 70. As a result, the switching loss generated in the central portion 62b is small, and the temperature rise of the central portion 62b is suppressed. On the other hand, the interval d1 between the connection regions 38 in the outer side portion 62a of the element region 62 is wide. Therefore, there are fewer paths for holes to flow from the bottom regions 36 to the body region 32, as compared to the central portion 62b. However, the outer side portion 62a is adjacent to the peripheral region 64. Since the contact region 31 does not exist in the peripheral region 64, holes are less likely to be accumulated in the drift region 34 of the peripheral region 64 during the forward biasing. Therefore, the density of holes accumulated in the drift region 34 during the forward biasing is lower in the outer side portion 62a than in the central portion 62b. With this, the recovery current in the outer side portion 62a is small. As such, even if the interval d1 between the connection regions 38 in the outer side portion 62a is wide, the density of the recovery current flowing through each connection region 38 is not so high. As a result, the switching loss generated in the outer side portion 62a is small, and the temperature rise of the outer side portion 62a is suppressed. In the present embodiment, as described above, when the recovery current flows, the temperature rise is suppressed in the element region 62 as a whole, and the switching loss is suppressed.

As described above, when the semiconductor device 10 is turned off, the depletion layer extends from the body region 32, the connection regions 38 and the bottom regions 36 to the drift region 34. As a result, substantially the entire drift region 34 is depleted. When a high voltage is applied to the lower electrode 72 while the semiconductor element 10 is in the off state, an avalanche current flows from the drift region 34 to the upper electrode 70 via the bottom regions 36, the connection regions 38, the body region 32 and the contact regions 31. In the central portion 62b, since the interval between the connection regions 38 is small, the density of the avalanche current flowing through each connection region 38 is low. As such, the temperature rise in the central portion 62b is suppressed. Further, in the outer side portion 62a, since the interval between the connection regions 38 is large, the density of the avalanche current flowing through each connection region 38 is high. However, since the outer side portion 62a is adjacent to the peripheral region 64, the outer side portion 62a has a higher heat dissipation property. Therefore, the temperature rise of the outer side portion 62a is suppressed. In this way, when the avalanche current occurs, the temperature rise is suppressed in each of the central portion 62b and the outer side portion 62a. Thus, in the present embodiment, the temperature rise is suppressed in the element region 62 as a whole when the avalanche current occurs. As such, the semiconductor device 10 has high avalanche resistance.

Although the semiconductor substrate 12 generates heat during operation of the semiconductor device 10, the heat is more easily released in the outer side portion 62a of the element region 62 than in the central portion 62b. The outer side portion 62a is adjacent to the peripheral region 64 in which the main current does not flow. Therefore, the temperature of the outer side portion 62a is less likely to rise than that of the central portion 62b, and the temperature of the outer side portion 62a is lower than the temperature of the central portion 62b. As such, even if the temperature rises in the outer side portion 62a, its influence is small. In the semiconductor device 10 of the present embodiment, as described above, an increase in switching loss and a decrease in avalanche resistance can be suppressed while reducing the on-resistance.

In the present embodiment, the direction (x direction) in which the bottom region 36 extends and the direction (y direction) in which the connection region 38 extends intersect to each other. Therefore, as compared to the configuration in which the bottom region 36 and the connection region 38 extend parallel to each other, the bottom region 36 and the connection region 38 can be connected more reliably.

Second Embodiment

Figure 5:
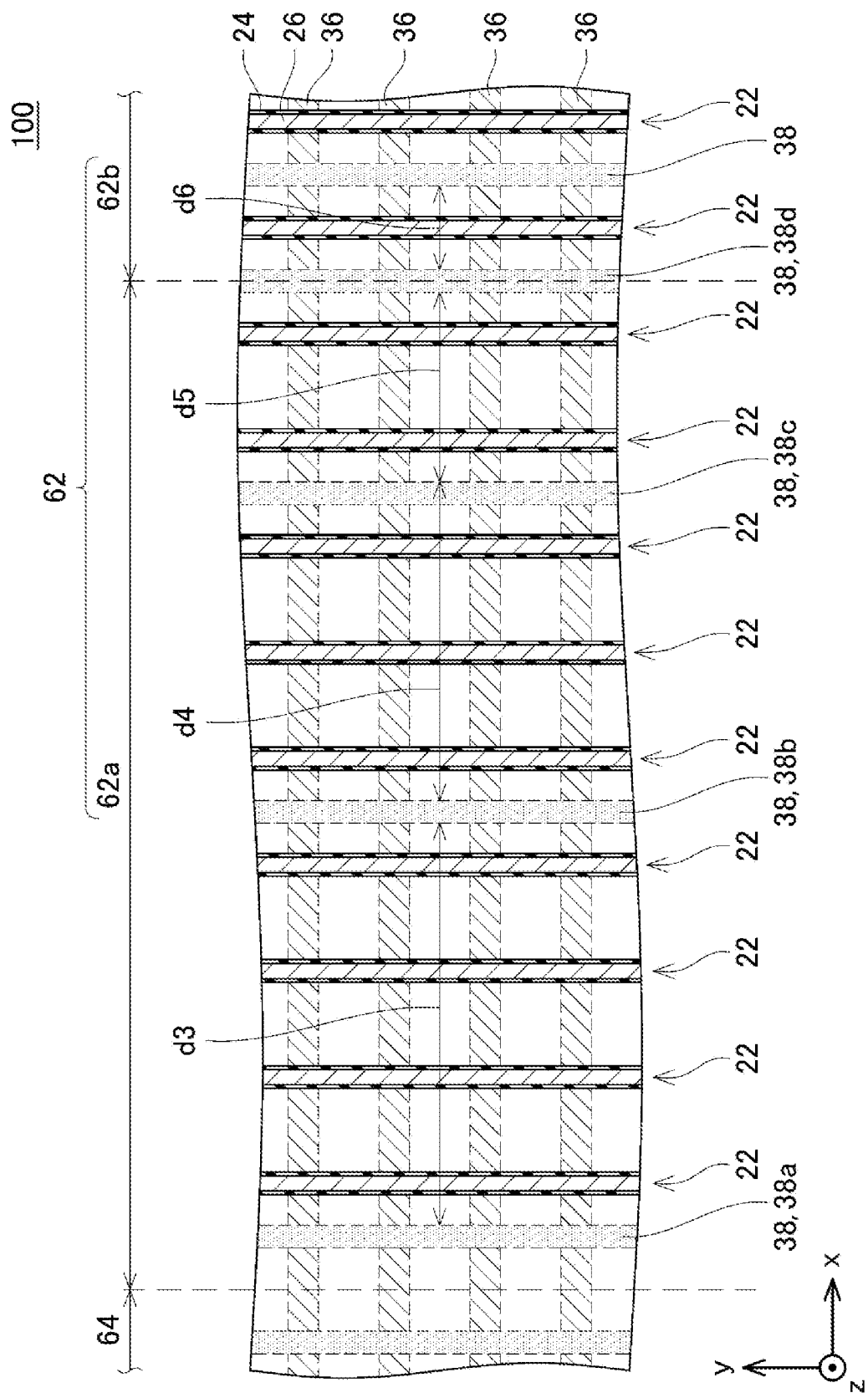
FIG. 5 is an enlarged plan view of a part of a semiconductor device including a boundary between an element region and a peripheral region according to a second embodiment of the present disclosure.

A semiconductor device 100 of a second embodiment differs from the semiconductor device 10 of the first embodiment in the configuration of the connection region 38. In the second embodiment, the interval between the connection regions 38 in the outer side portion 62a increases toward the end of the element region 62. As shown in FIG. 5, in the second embodiment, the outer side portion 62a has nine trenches 22. Further, the outer side portion 62a has four connection regions 38. In the second embodiment, the width of the outer side portion 62a in the x direction is greater than that in the first embodiment. In the following description, for the sake of convenience, the connection regions 38 provided in the outer side portion 62a are labelled as first connection region 38a, second connection region 38b, third connection region 38c and fourth connection region 38d in order from the outermost one that is the closest to the outer peripheral region 64 toward the central portion 62b. As shown in FIG. 5, an interval d3 between the first connection region 38a and the second connection region 38b is larger than an interval d4 between the second connection region 38b and the third connection region 38c. The interval d4 is larger than an interval d5 between the third connection region 38c and the fourth connection region 38d. Also, the intervals d3, d4, and d5 are larger than an interval d6 between the connection regions 38 in the central portion 62b.

Four trenches 22 are arranged between the first connection region 38a and the second connection region 38b, and three trenches 22 are arranged between the second connection region 38b and the third connection region 38c. Further, two trenches 22 are arranged between the third connection region 38c and the fourth connection region 38d. The interval between any two adjacent trenches 22 is substantially equal between the outer side portion 62a and the central portion 62b.

When a forward biased voltage is applied to the body diode, the amount of holes accumulated in the drift region 34 decreases toward the end of the element region 62. In the semiconductor device 100 of the second embodiment, the intervals between the connection regions 38 are gradually increased in the outer side portion 62a from the central portion 62b toward the peripheral region 64. In the second embodiment, since the connection regions 38 are arranged more sparsely than in the first embodiment, the on-resistance can be further reduced. Moreover, since the intervals d3 to d5 of the connection regions 38 are adjusted according to the distribution of the amount of holes accumulated in the drift region 34, the switching loss can be efficiently reduced.

Third Embodiment

Figure 6:
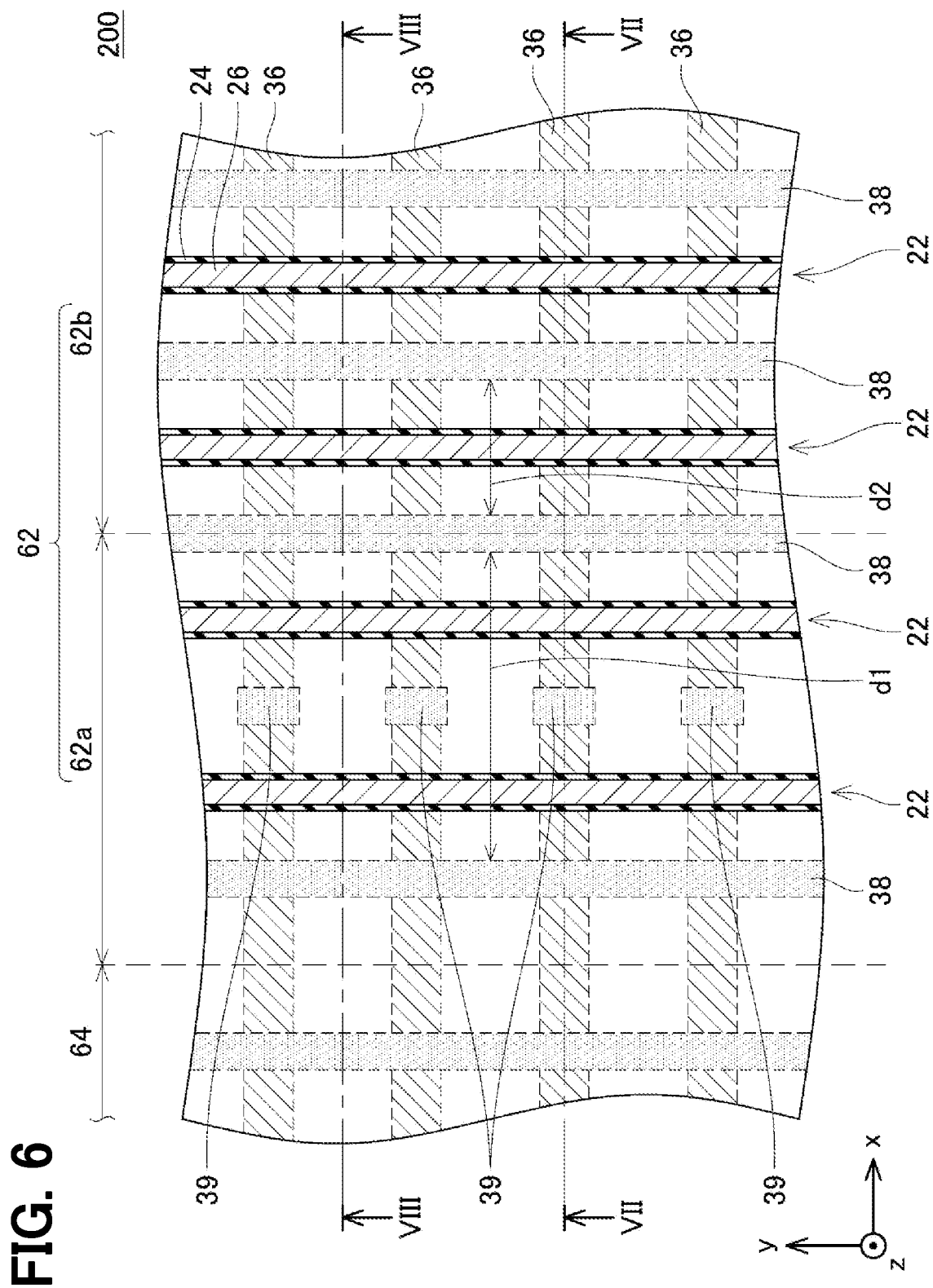
FIG. 6 is an enlarged plan view of a part of a semiconductor device including a boundary between an element region and a peripheral region according to a third embodiment of the present disclosure.
Figure 7:
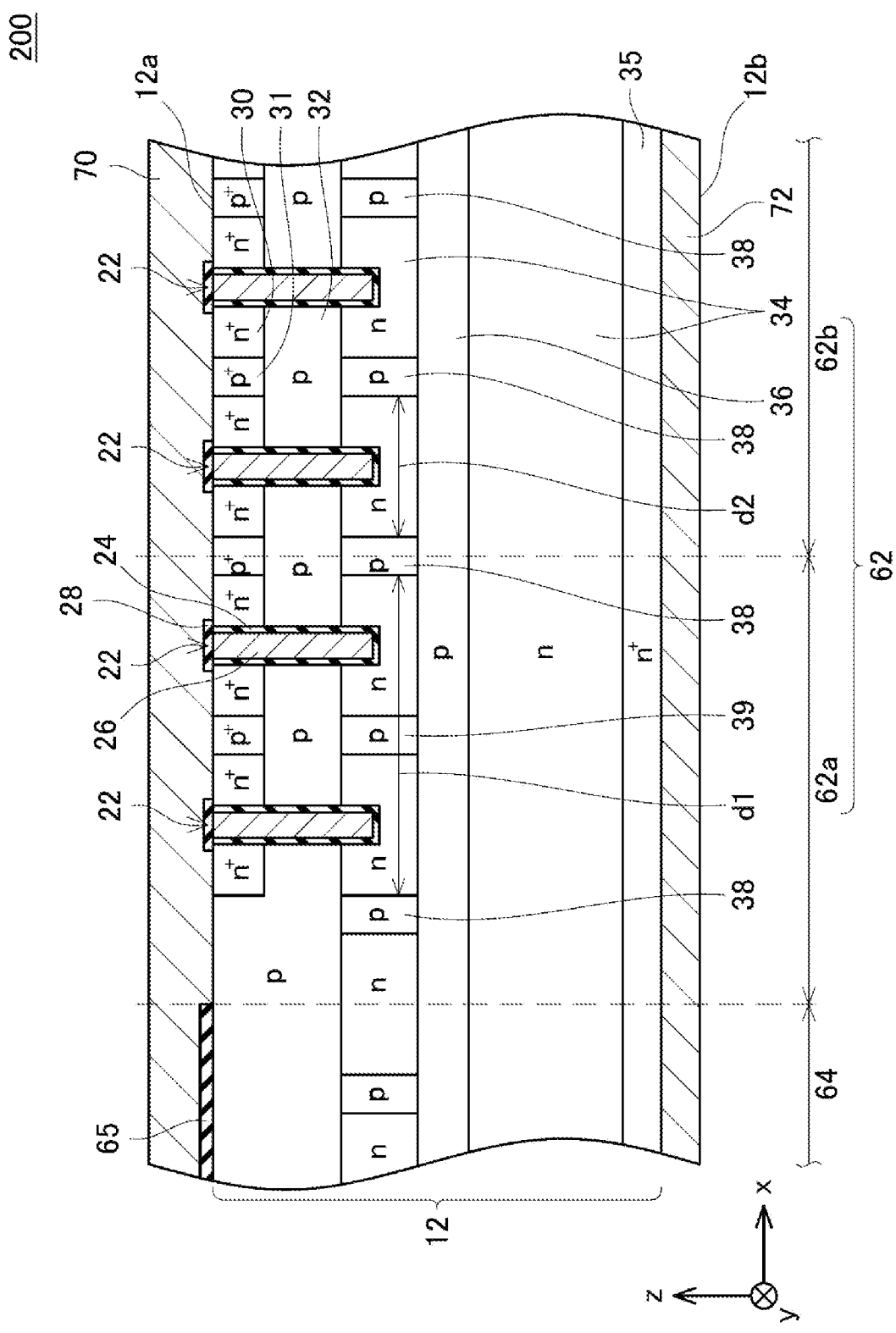
FIG. 7 is a cross-sectional view taken along a line VII-VII of FIG. 6.
Figure 8:
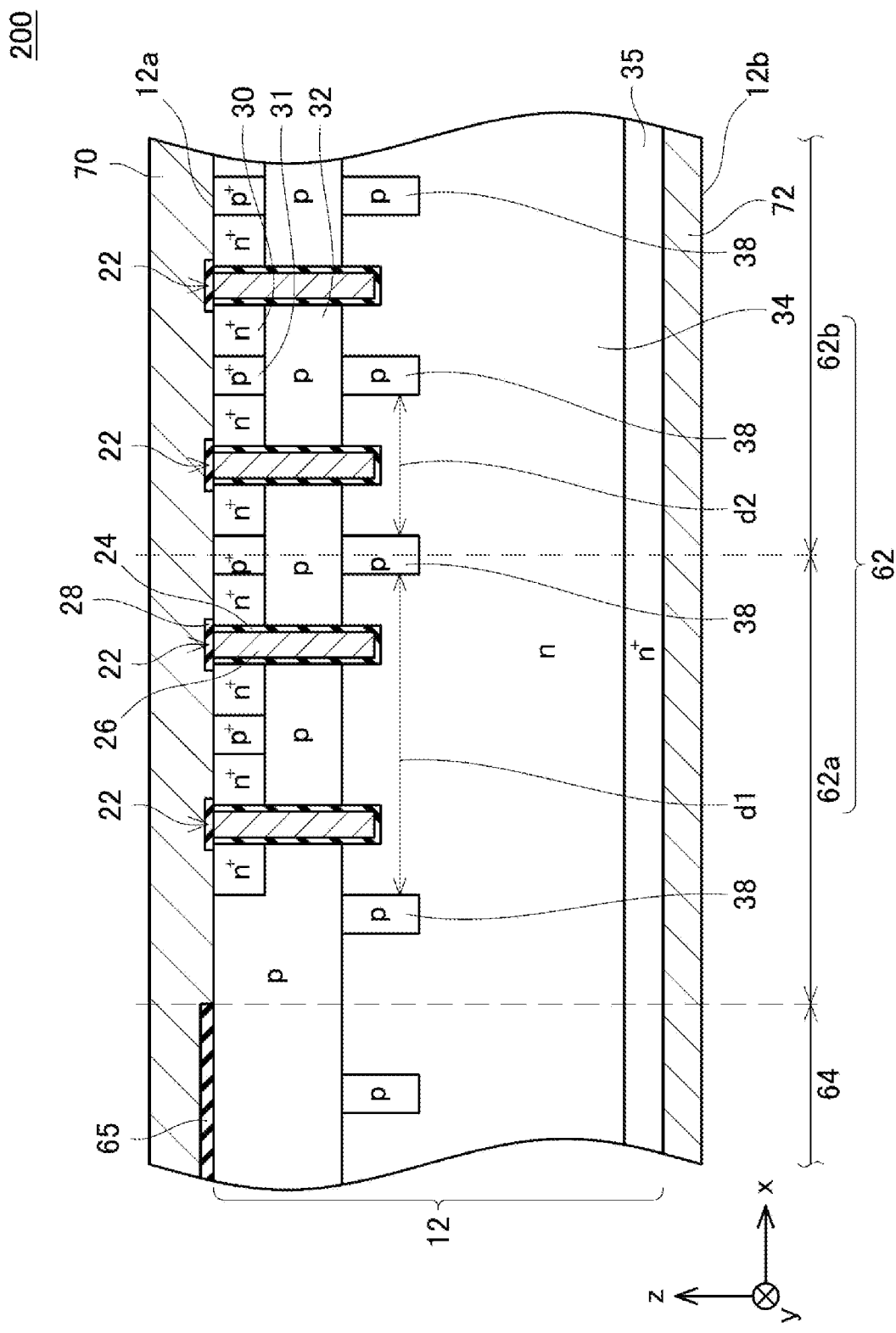
FIG. 8 is a cross-sectional view taken along a line VIII-VIII of FIG. 6.

A semiconductor device 200 of a third embodiment differs from the semiconductor device 10 of the first embodiment in that multiple p-type auxiliary connection regions 39 are additionally provided in the outer side portion 62a. As shown in FIGS. 6 and 7, the auxiliary connection regions 39 are arranged in a range defined between the two trenches 22 in the outer side portion 62a. As shown in FIG. 6, the auxiliary connection regions 39 are arranged at intervals in the y direction. As shown in FIG. 7, each auxiliary connection region 39 connects the body region 32 and the bottom region 36. As shown in FIG. 8, the auxiliary connection region 39 is not arranged in the section where the bottom region 36 is not arranged.

In the third embodiment, when a reverse biased voltage is applied to the body diode, the holes flow from the bottom regions 36 to the body region 32 via the connection regions 38 as well as the auxiliary connection regions 39 in the outer side portion 62a. In the third embodiment, the holes can flow while branching in more paths than that in the first embodiment. Thus, the switching loss can be further reduced. The auxiliary connection regions 39 are arranged at intervals in the y direction. Specifically, as shown in FIGS. 6 and 7, the auxiliary connection regions 39 are arranged only in the areas directly above the bottom regions 36. Therefore, when the semiconductor device 200 is in the off state, the depletion layer extending from the auxiliary connection regions 39 to the drift region 34 does not extend widely in the drift region 34. As such, even if the auxiliary connection regions 39 exist, the path of the main current is less likely to be restricted when the semiconductor device 200 is turned on. Further, the auxiliary connection regions 39 are arranged only in the areas directly above the bottom regions 36 that do not function as the main current path when the semiconductor device 200 is turned on. Therefore, even if the auxiliary connection regions 39 exist, the on-resistance hardly increases. In the semiconductor device 200 of the third embodiment, as described above, the switching loss can be further reduced while suppressing the increase in on-resistance.

Fourth Embodiment

Figure 9:
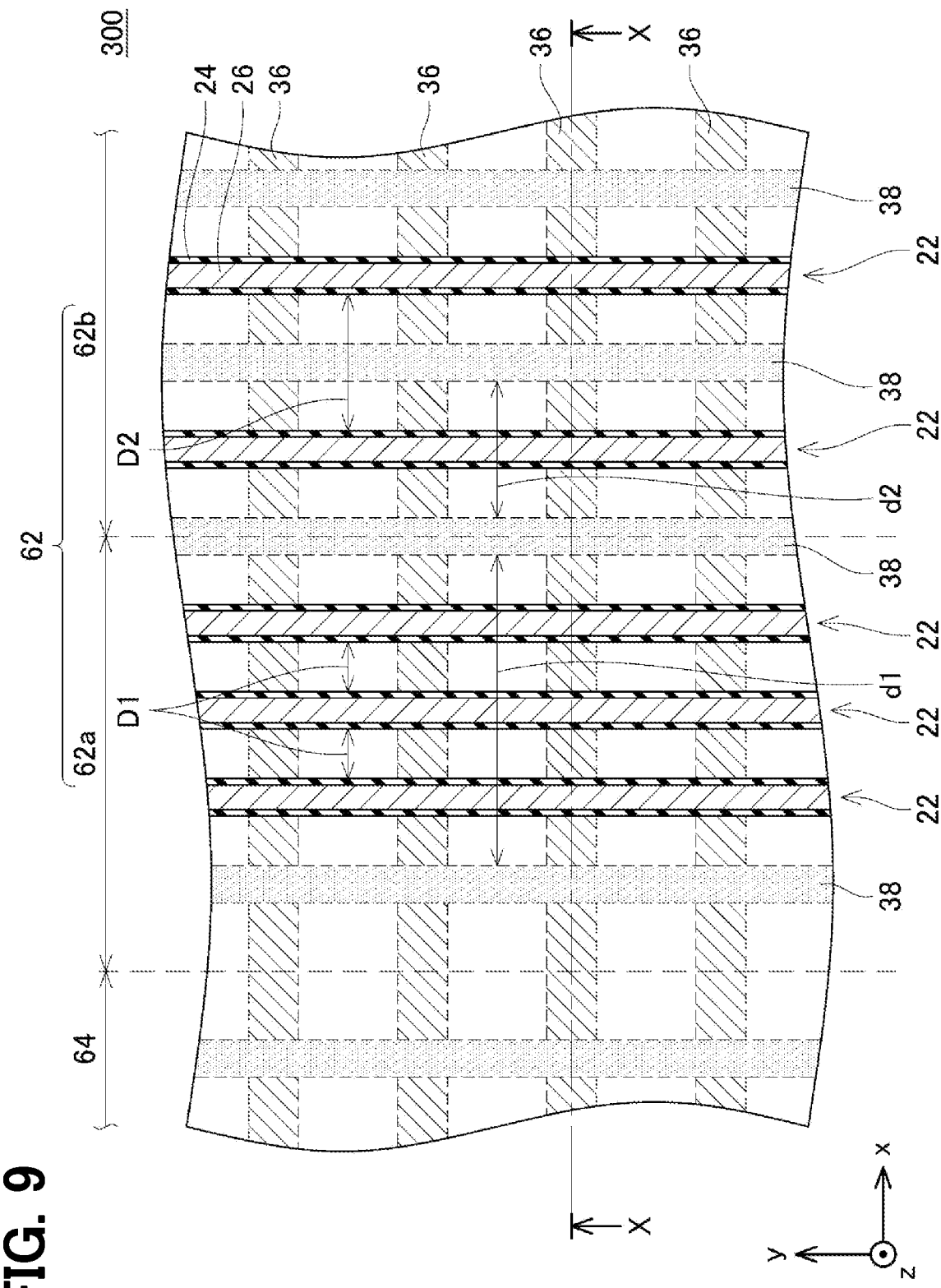
FIG. 9 is an enlarged plan view of a part of a semiconductor device including a boundary between an element region and a peripheral region according to a fourth embodiment of the present disclosure.
Figure 10:
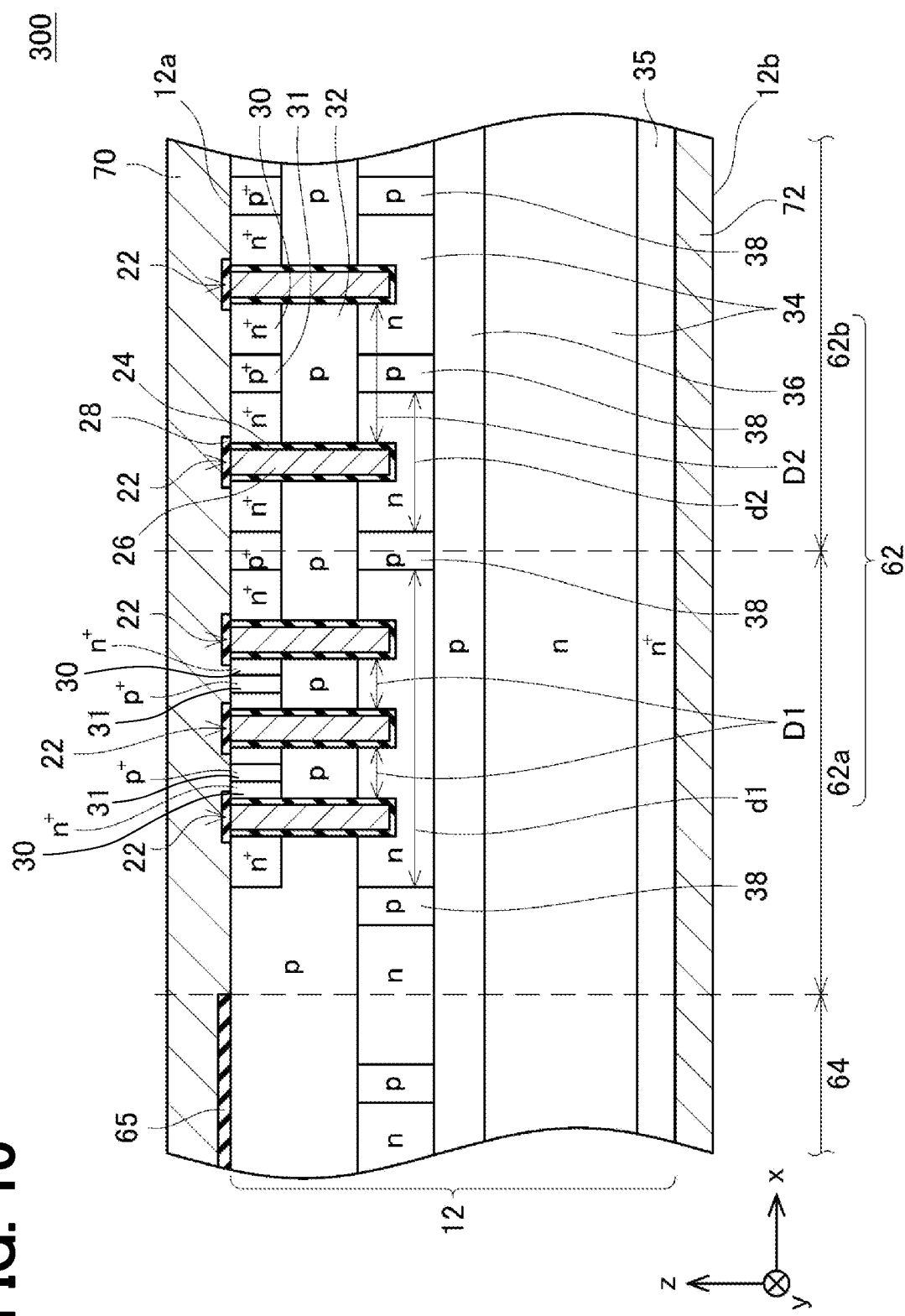
FIG. 10 is a cross-sectional view taken along a line X-X of FIG. 9.

A semiconductor device 300 of a fourth embodiment differs from the semiconductor device 10 of the first embodiment in that the interval of the trenches 22 in the outer side portion 62a is different. As shown in FIG. 9, in the fourth embodiment, three trenches 22 are arranged in a range defined between the two connection regions 38 in the outer side portion 62a. An interval D1 between the trenches 22 in the outer side portion 62a is smaller than an interval D2 between the trenches 22 in the central portion 62b. As shown in FIG. 10, the source region 30, the contact region 31, the body region 32 and the drift region 34 are provided in a semiconductor region defined between two adjacent trenches 22 in the outer side portion 62a.

In the fourth embodiment, since the interval D1 between the trenches 22 in the outer side portion 62a is small, that is, the trenches 22 are densely arranged in the outer side portion 62a, the channel density of the outer side portion 62a is higher than that in the first embodiment. In the fourth embodiment, therefore, the channel resistance, that is, the on-resistance can be further reduced. Also in the present embodiment, since the interval between the connection regions 38 of the outer side portion 62a is larger than the interval between the connection regions 38 of the central portion 62b, the path of the main current is less likely to be restricted in the outer side portion 62a. Therefore, even if the interval D1 between the trenches 22 is reduced in the outer side portion 62a, the on-resistance due to the existence of the connection regions 38 hardly increases.

Although the embodiments have been described in detail above, these are merely examples and do not limit the scope of claims. The techniques described in the claims include various modifications and modifications of the specific examples illustrated above. The embodiments described hereinabove will be modified as follows.

(Modifications)

Figure 11:
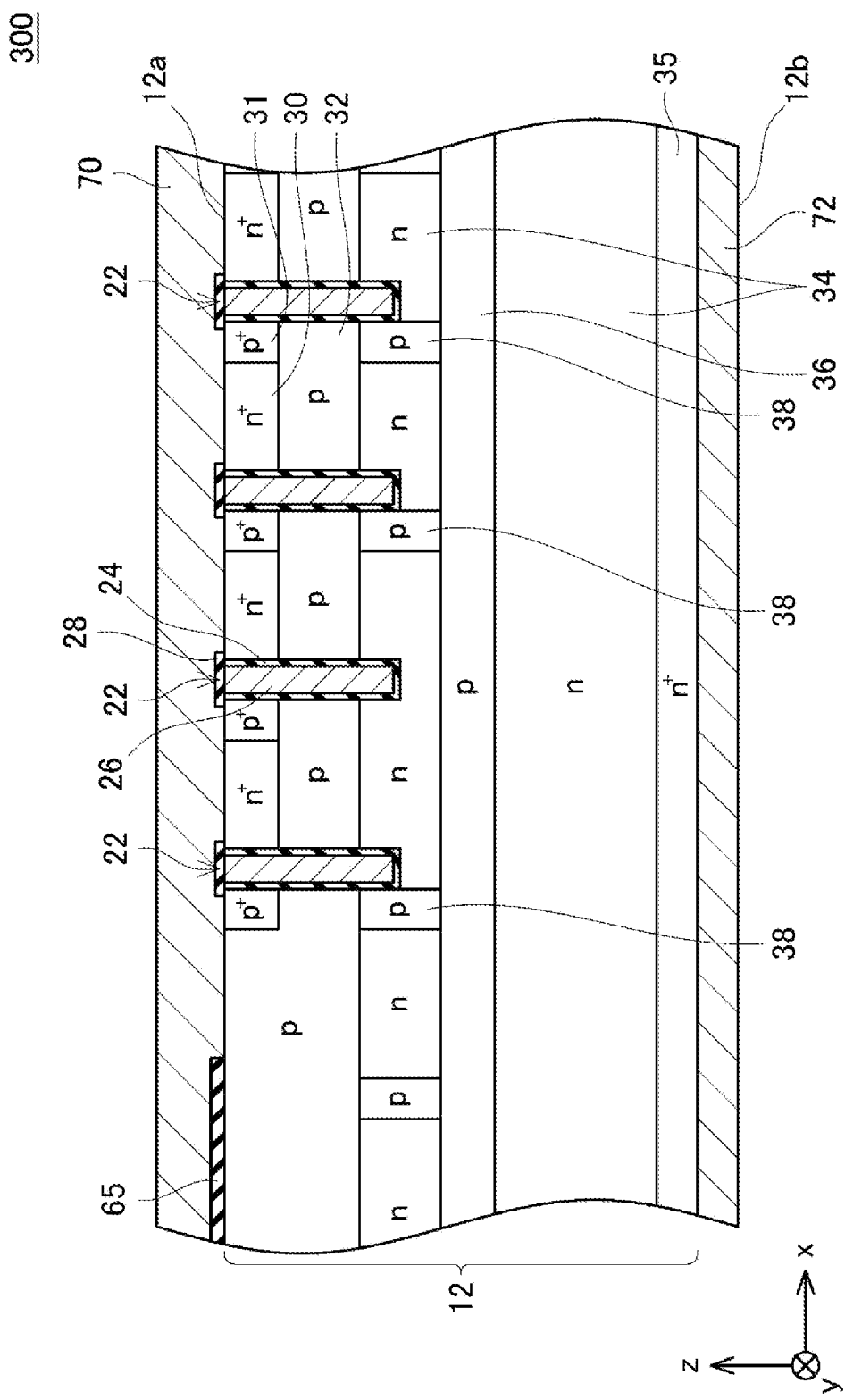
FIG. 11 is a cross-sectional view, corresponding to FIG. 3, of a semiconductor device according to a modification.

In each of the embodiments described above, the connection region 38 is arranged in the area between the trenches 22. In other words, the connection region 38 is spaced apart from the trenches 22. As a modification, as shown in FIG. 11, the connection region 38 may be arranged at a position in contact with the side surface of the trench 22. The connection region 38 may be in contact with the gate insulating film 24, which is disposed in the trench 22, at a position below the body region 32. The connection region 38 may extend in the y direction along the side surface of the trench 22. Further, in this modification, the contact region 31 may be arranged at a position in contact with the side surface of the trench 22. The contact region 31 may be in contact with the gate insulating film 24, which is disposed in the trench 22, on the side surface of the trench 22.

Figure 12:
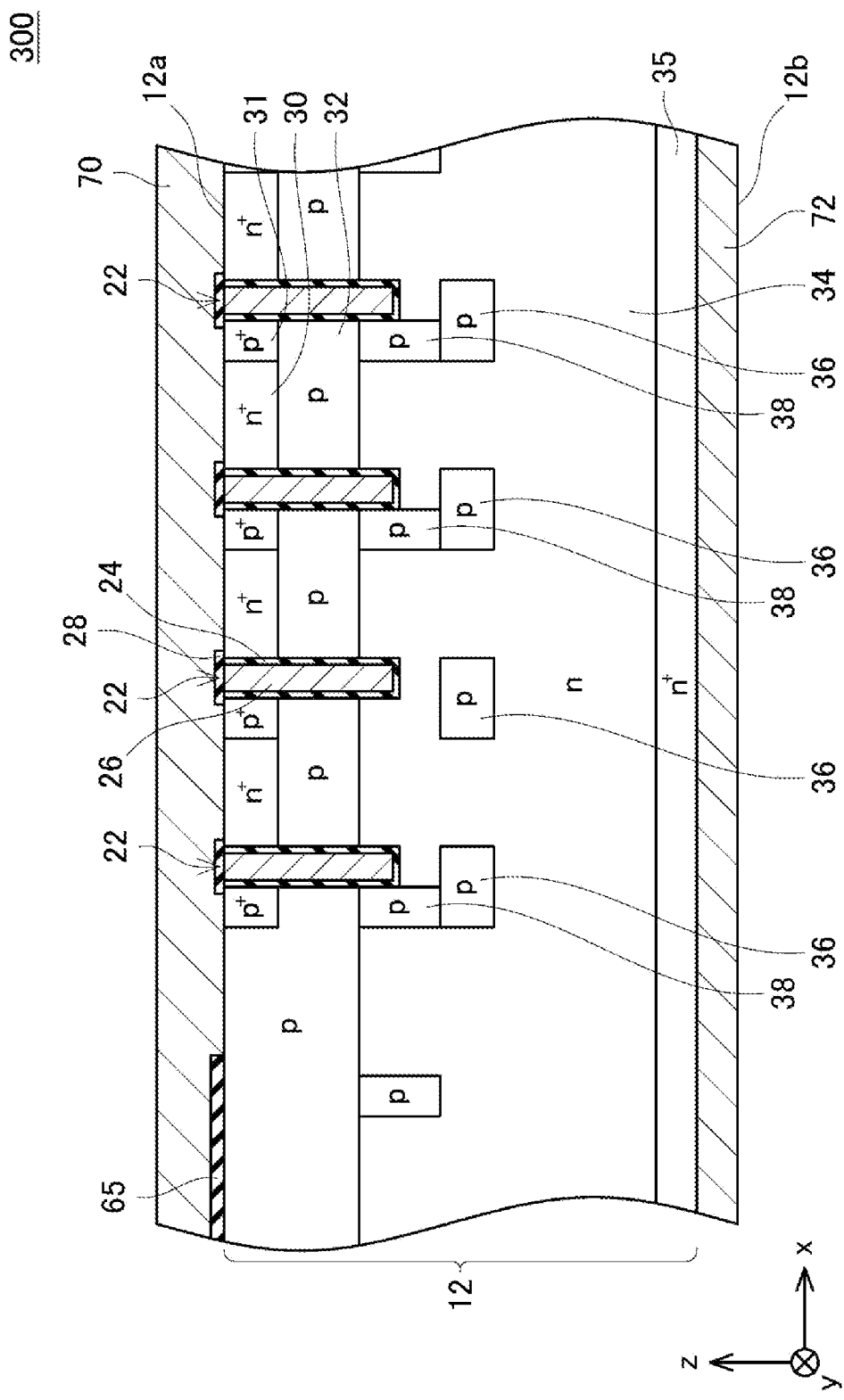
FIG. 12 is a cross-sectional view, corresponding to FIG. 3, of a semiconductor device according to another modification.

In each of the embodiments described above, the bottom region 36 extends in the direction perpendicular to the longitudinal direction (y direction) of the trench 22. As another modification, as shown in FIG. 12, the bottom region 36 may extend parallel to the trench 22, that is, extends along the longitudinal direction of the trench 22. The bottom region 36 may be spaced from the bottom surface of the trench 22 and extend along the bottom surface of the trench 22. The bottom region 36 may be arranged to spaced apart in a direction (x direction) perpendicular to the longitudinal direction of the trenches 22.

While only the exemplary embodiments and examples have been chosen to illustrate the present disclosure, it will be apparent to those skilled in the art from the specification and drawings that various changes and modifications can be made therein without departing from the scope of the disclosure as defined in the appended claims. Furthermore, the foregoing description of the exemplary embodiments and examples according to the present disclosure is provided for illustration only, and not for the purpose of limiting the disclosure as defined by the appended claims and their equivalents. The technical elements described in the present specification or the drawings exhibit technical usefulness alone or in various combinations, and are not limited to the combinations described in the claims at the time of filing. In addition, the techniques illustrated in the present specification or drawings achieve multiple objectives at the same time, and achieving one of the objectives itself has technical usefulness.

What is claimed is:

1. A semiconductor device comprising:
   a semiconductor substrate having an element region and a peripheral region disposed on a periphery of the element region;
   a plurality of trenches defined on an upper surface of the semiconductor substrate, each of the plurality of trenches extending in a first direction along the upper surface of the semiconductor substrate, the plurality of trenches being arranged spaced apart from each other in a second direction that is along the upper surface of the semiconductor substrate and perpendicular to the first direction;

a gate insulating film covering an inner surface of each of the plurality of trenches; and a gate electrode disposed in each of the plurality of trenches and insulated from the semiconductor substrate by the gate insulating film, wherein the element region includes:

an n-type source region that is exposed on the upper surface of the semiconductor substrate and is in contact with the gate insulating film disposed in a corresponding trench;

a p-type contact region that is exposed on the upper surface of the semiconductor substrate;

a p-type body region that is in contact with the gate insulating film disposed in the corresponding trench at a position below the source region, and is in contact with the contact region;

an n-type drift region that is in contact with the gate insulating film disposed in the corresponding trench at a position below the body region, and is separated from the source region by the body region;

a p-type bottom region that is disposed below the corresponding trench and spaced from a bottom surface of the corresponding trench, and is surrounded by the drift region; and a plurality of p-type connection regions that connects the body region and the bottom region, each of the plurality of p-type connection regions extending in the first direction, and the plurality of p-type connection regions being arranged spaced apart from each other in the second direction, wherein the element region has outer side portions at opposite ends of the element region in the second direction, and a central portion defined between the outer side portions, and wherein an interval in the second direction between the connection regions provided in at least one of the outer side portions is greater than an interval in the second direction between the connection regions provided in the central portion.

2. The semiconductor device according to claim 1,
wherein the interval in the second direction between the connection regions provided in the at least one of the outer side portions increases toward a corresponding end of the element region.

3. The semiconductor device according to claim 1,
wherein a plurality of the bottom regions extends in the second direction, and is arranged spaced apart from each other in the first direction.

4. The semiconductor device according to claim 3,
wherein the at least one of the outer side portions further includes a plurality of p-type auxiliary connection regions arranged spaced apart from each other in the first direction, and
wherein each of the plurality of p-type auxiliary connection regions connects the body region and a corresponding bottom region.

5. The semiconductor device according to claim 1,
wherein an interval in the second direction between the trenches provided in the at least one of the outer side portions is smaller than an interval in the second direction between the trenches provided in the central portion.

* * * * *